US006803710B1

(12) United States Patent
Ikegami et al.

(10) Patent No.: US 6,803,710 B1
(45) Date of Patent: Oct. 12, 2004

(54) SHADOW MASK WITH CURVED AND RECTANGULAR SLOTS

(75) Inventors: Takeshi Ikegami, Tokyo (JP); Toshihiro Hatori, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 09/646,992

(22) PCT Filed: Jan. 25, 2000

(86) PCT No.: PCT/JP00/00354

§ 371 (c)(1), (2), (4) Date: Sep. 25, 2000

(87) PCT Pub. No.: WO00/45413

PCT Pub. Date: Aug. 3, 2000

(30) Foreign Application Priority Data

Jan. 26, 1999 (JP) .......................................... P11-16524

(51) Int. Cl.$^{7}$ ................................................ H01J 29/80

(52) U.S. Cl. ....................................... 313/402; 313/403

(58) Field of Search ................................ 313/402, 403, 313/407, 408

(56) References Cited

U.S. PATENT DOCUMENTS 5,280,215 A * 1/1994 Ohtake et al. .............. 313/403
5,730,887 A * 3/1998 Simpson et al. .............. 216/12
5,856,725 A * 1/1999 Ueda .......................... 313/402
6,313,574 B1 * 11/2001 Banno et al. ............... 313/402

FOREIGN PATENT DOCUMENTS

| | | |
|---|---|---|
| JP | 01320738 | 12/1989 |
| JP | 10241596 | 9/1998 |
| JP | 2000036258 | 2/2000 |

* cited by examiner

*Primary Examiner*—Nimeshkumar D. Patel
*Assistant Examiner*—German Colón
(74) *Attorney, Agent, or Firm*—Timothy J. Keefer; Seyfarth Shaw LLP

(57) ABSTRACT

A shadow mask with a slot having a substantially rectangular shape and a curved slot. The rectangular slot is composed of a back side opening formed on an electron beam incident side, a front side opening having a large area to allow the electron beam to pass, and a side wall sections inclining between the back side opening and the front side opening. The curved slot is composed of a back side opening (11) formed on the electron beam incident side and curved such that both longitudinal end portions are apart from an axis of ordinate passing a central portion of the shadow mask, a front side opening (2) formed having a large area to allow the electron beam to pass and side wall section (3 - - - 6) inclining between the back side opening and the front side opening.

3 Claims, 7 Drawing Sheets

[Fig. 1]
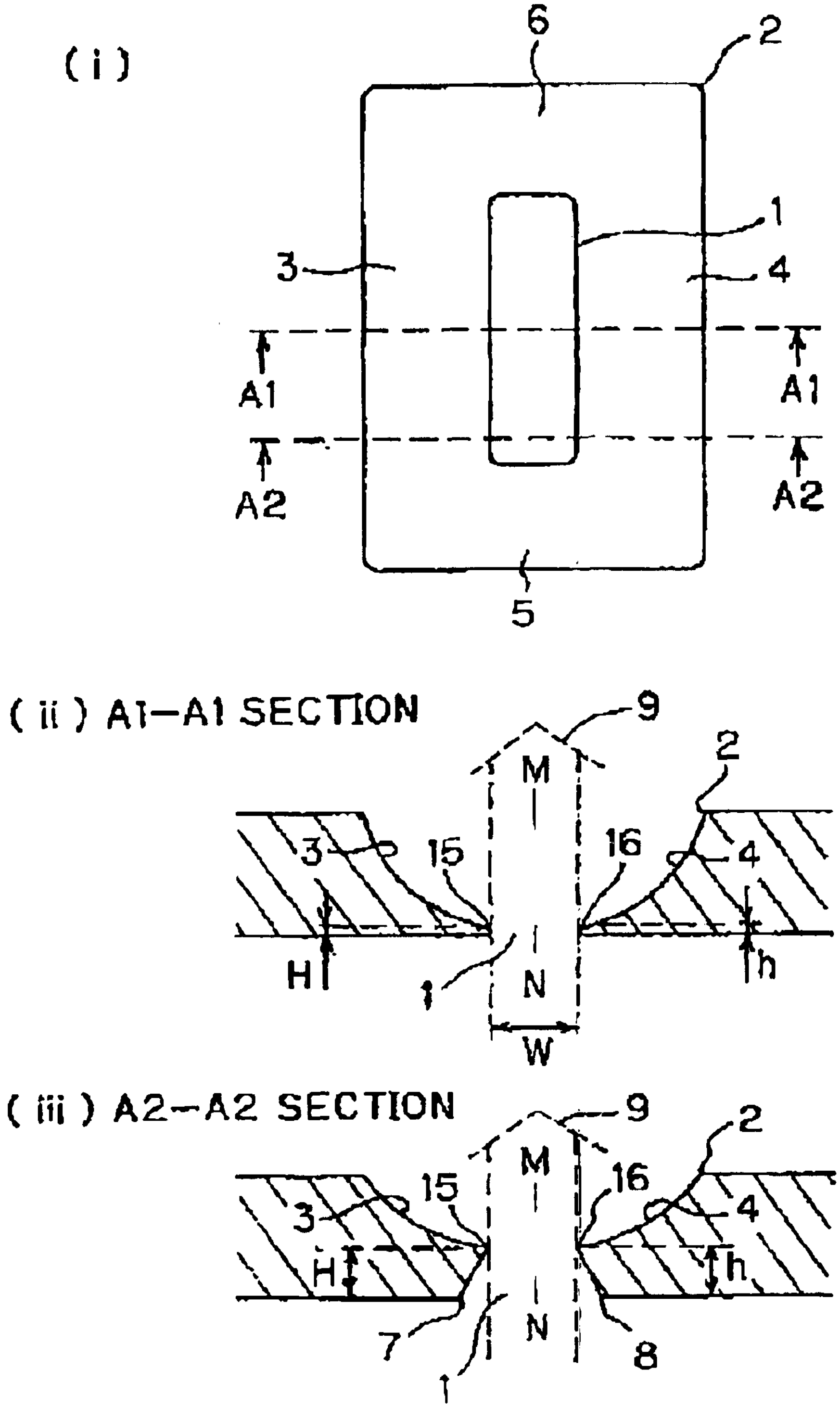

[Fig. 2]
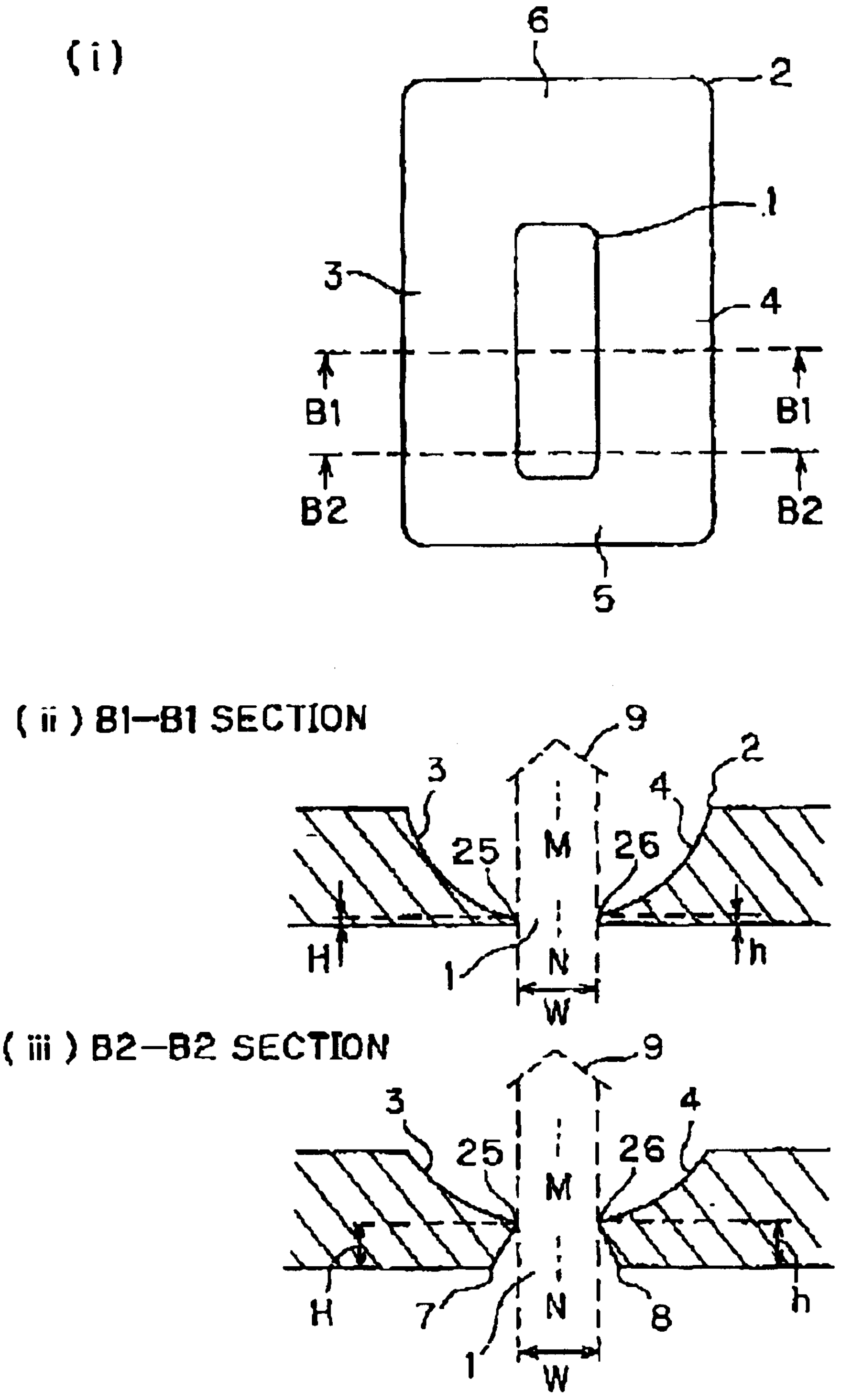

[Fig. 3]
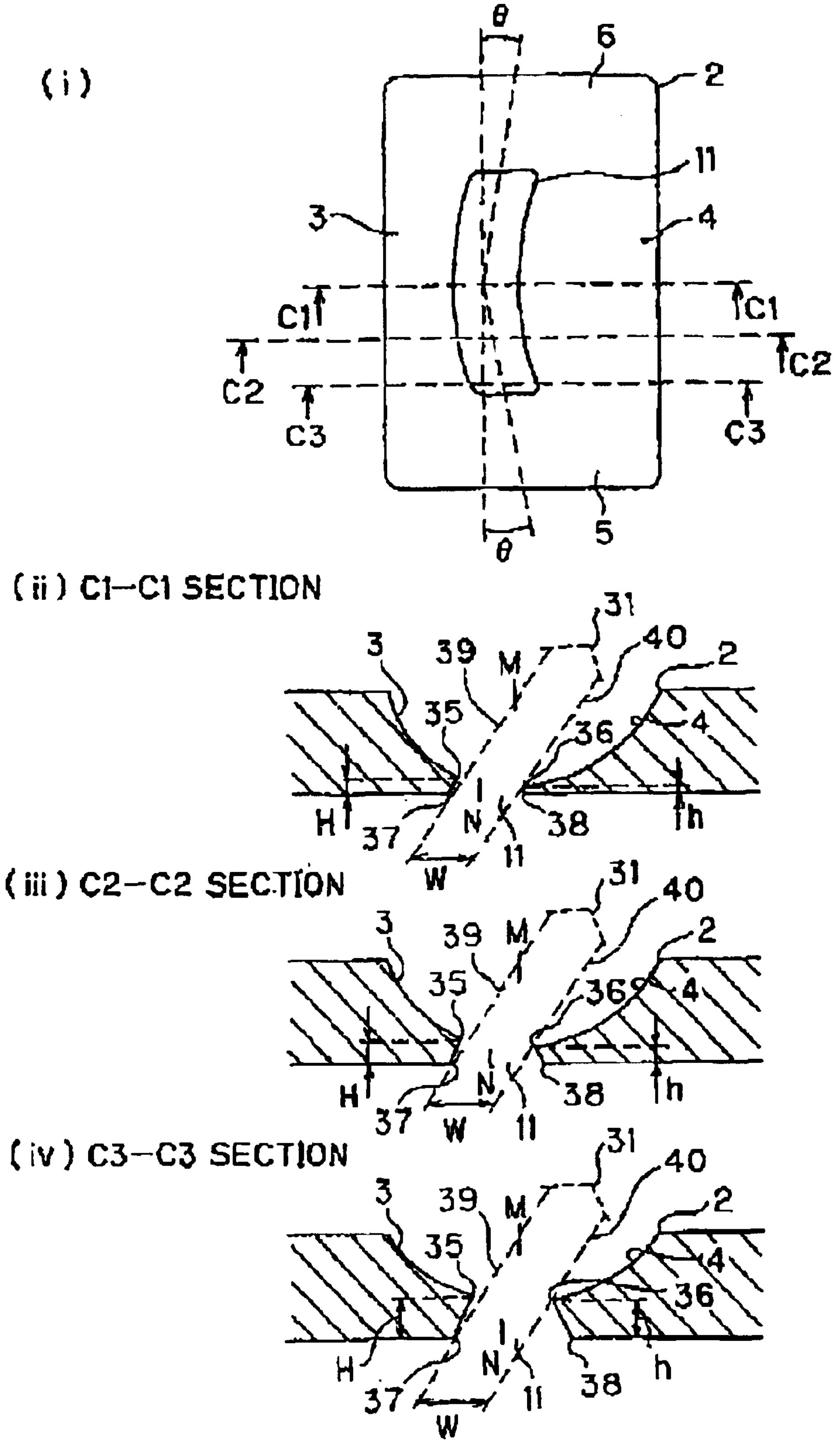

[Fig. 4]
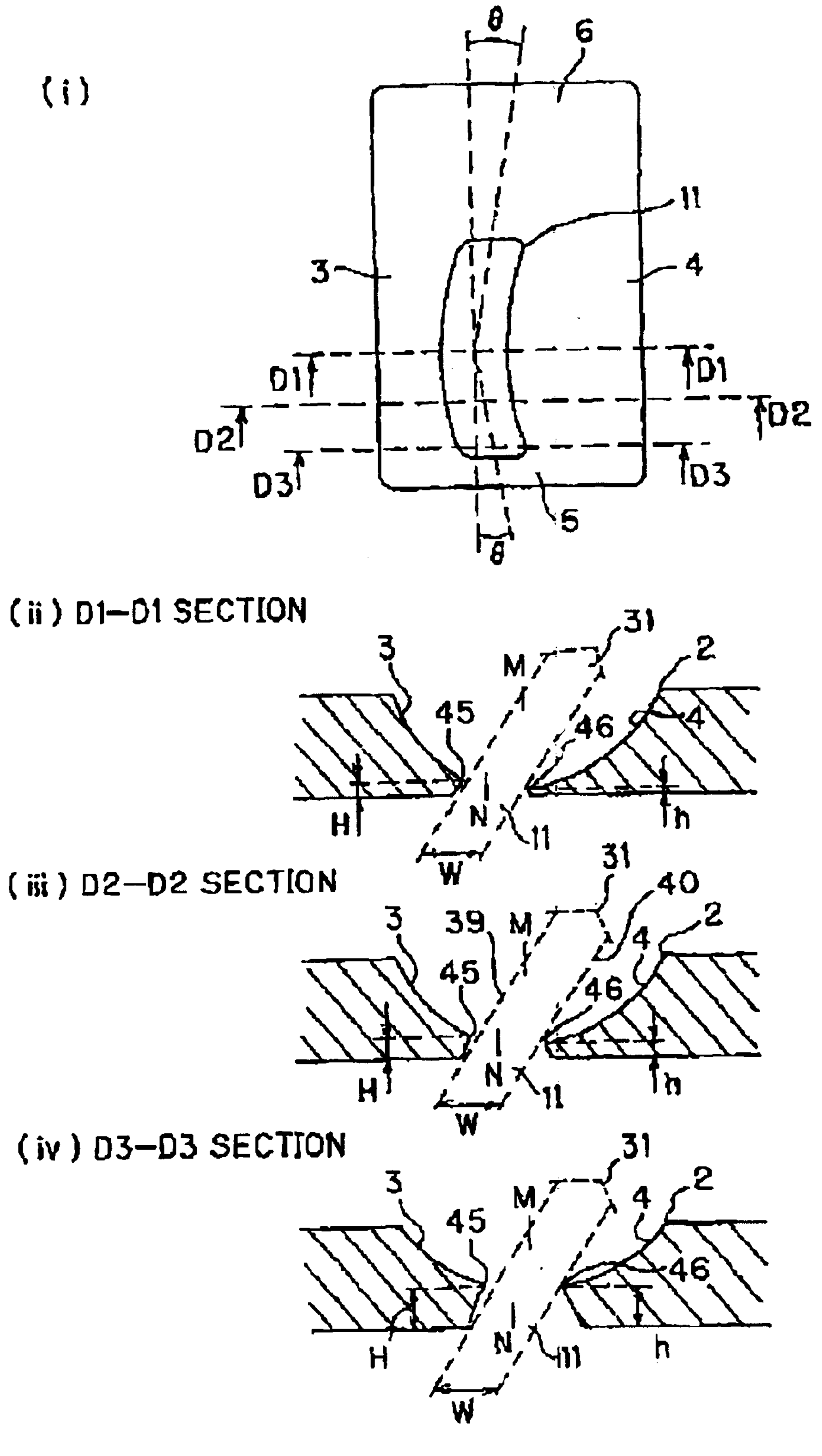

[Fig. 5]
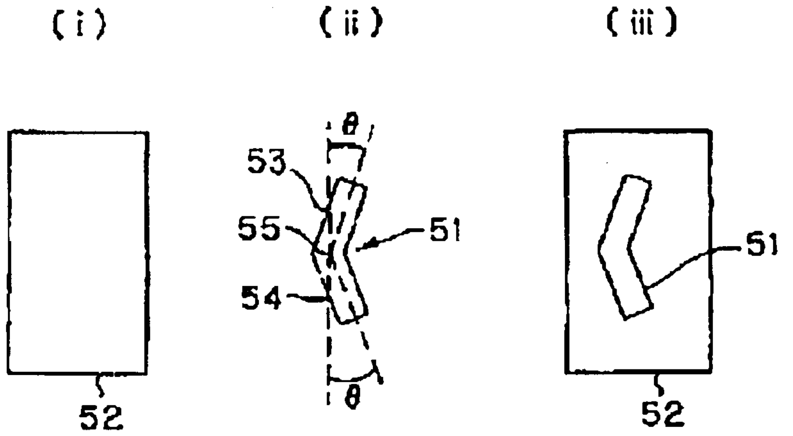
[Fig. 6]
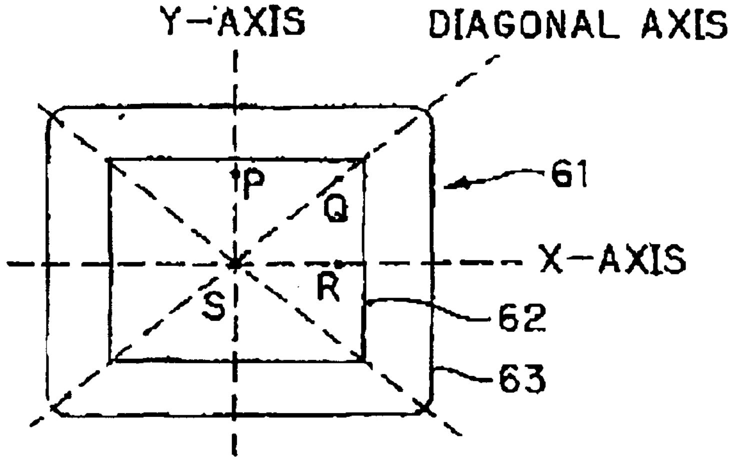
[Fig. 7]
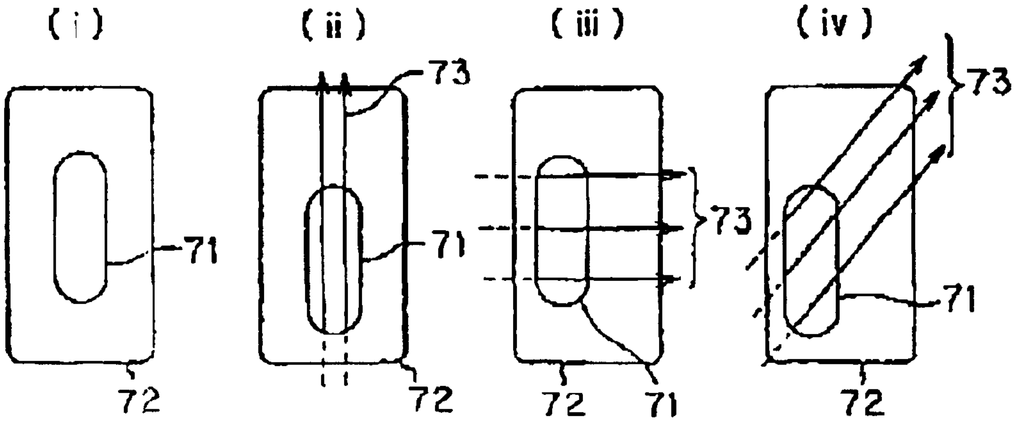

[Fig. 8]
(i)
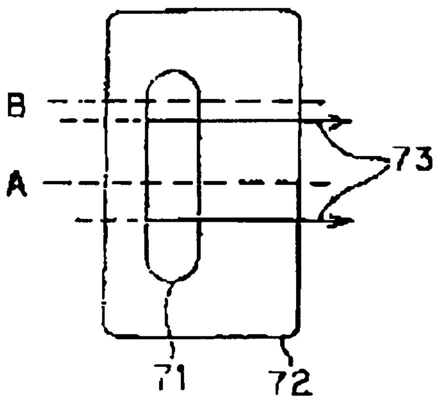
(ii)
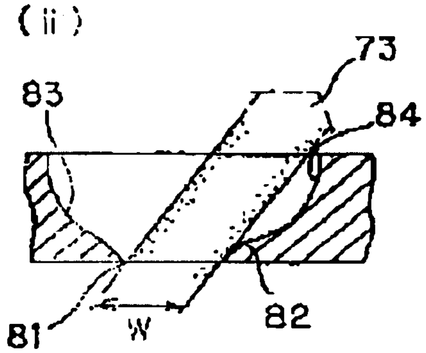
(iii)
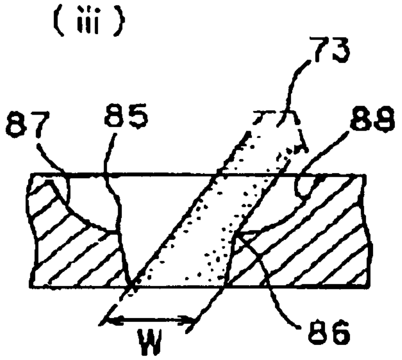
[Fig. 9]
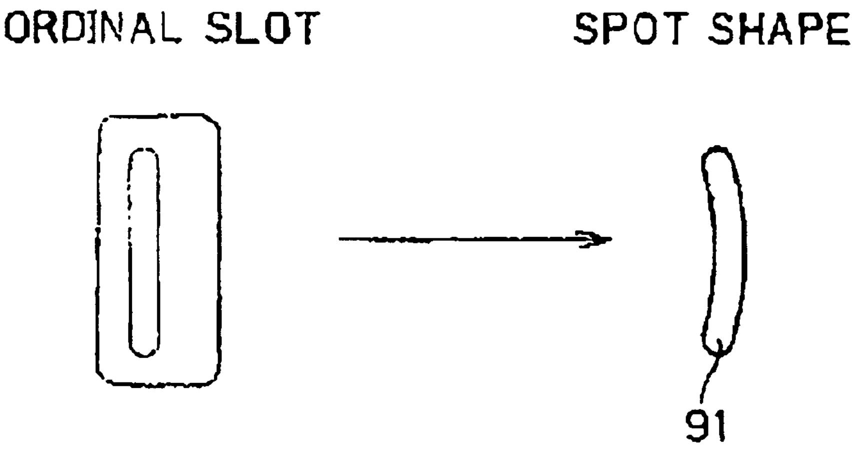

[Fig. 10]
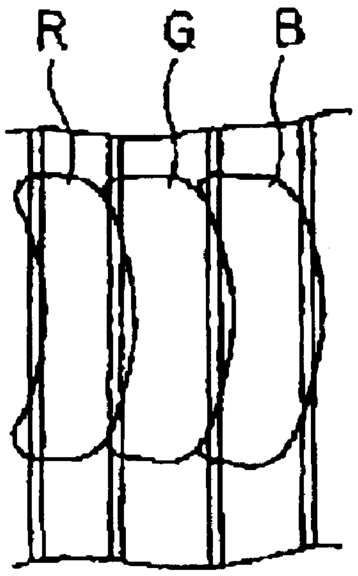

SHADOW MASK WITH CURVED AND RECTANGULAR SLOTS

CROSS REFERENCE TO RELATED APPLICATION

This application claims the priority of Japanese patent application Serial No. P11-16524 filed on Jan. 26, 1999.

This application is a 371 application of PCT/JP00/00354, filed Jan. 25, 2003.

FIELD OF THE INVENTION

The present invention relates to a shadow mask for a Braun tube formed with substantially a rectangular slot and a curved slot for forming a beam, having substantially a rectangular shape, uniformly on a fluorescent surface of a color Braun tube.

BACKGROUND ART

FIG. 6 is a general view of a shadow mask for a color Braun tube having a plurality of slots each in substantially a rectangular shape. A conventional shadow mask 61 is composed of a slot forming portion 62 and a skirt forming portion 63. An electron beam passing a slot enters directly linearly into the slot at a central portion S of the shadow mask, but it enters obliquely to the slot as directed to an outer peripheral portion thereof. For this reason, a front side opening and a back side opening of the slot of the conventional shadow mask are adjusted in the opening forming positions thereof.

FIG. 7 is a schematic view showing a positional relationship between the front side opening and the back side openings of the respective slots of the conventional shadow mask. As shown in FIG. 7(i), the central slot of the shadow mask is composed of a front side opening 72 subjected to an etching process with a large area so as not to obstruct the passing of the electron beam and a back side opening 71, which is disposed substantially the central portion of the front side opening 72, as electron beam 73 entering side. On the other hand, the slots on the outer peripheral side of the shadow mask, for example, a slot formed at the point P on the Y-axis of coordinate in FIG. 6, a slot formed at the point R on the X-axis thereof and a slot formed at the point Q on the diagonal coordinate in FIG. 6, are shown in FIGS. 7(ii), (iii) and (iv), respectively, and the front side openings 72 of these slots are arranged so as to be shifted towards the outer peripheral side of the shadow mask 61 with respect to the back side openings 71 so as not to obstruct the passing of the electron beams 73 obliquely entering with respect to the slots.

In the shadow mask of such structure, in order to prevent a thermal deformation (referred to as doming) caused through a collision of the electron beam with the shadow mask, a thin metal plate formed of a material having a small thermal expansion coefficient such as nickel-iron alloy is used as a thin metal plate for the shadow mask. However, because the shadow mask manufactured with such thin metal plate is expensive, a shadow mask formed by making thick a cheap soft steel plate has been used to thereby suppress the thermal expansion of the shadow mask applied to the Braun tube and, hence, to prevent the occurrence of the doming.

The use of the thickened plate for the shadow mask makes large a height of a sectional area of the slot formed through the etching working. For this reason, as the slots formed on the side of the outer periphery as shown in FIGS. 7(ii), (iii) and (iv), with the slots whose front side openings 72 are merely shifted, the obliquely entering electron beam 73 is shut off by the thickened portion of the slot. As a result, the electron beam 73 cannot landed with a predetermined shape on a fluorescent surface of the Braun tube, thus providing a problem.

FIGS. 8 to 10 are schematic views for explaining such problem. FIG. 8(i) is a view showing the shape of the slot formed at the R point on the X-axis of coordinate shown in FIG. 6, in which the front side opening 72 is formed through the etching working with the back side opening 71 being shifted from the front side opening 72. The electron beam 73 passing through the central portion A of the slot can pass, with a desired width W as shown if FIG. 8(ii), a portion between side wall sections 83 and 84 to which thin steps 81 and 82 are formed through the sufficient etching process. On the other hand, the electron beam 73 passing through the upper end portion B in the longitudinal direction of the slot is shut off by a step 86, having a large thickness, formed to a side wall section 88, which is not subjected to the sufficient etching process, as shown by the sectional view of FIG. 8(iii), and hence, this electron beam 73 cannot pass with the desired width W. As mentioned above, the difference of the shapes of the side wall sections, particularly, the thicknesses of the steps are the ventral portion A and the longitudinal upper end portion B resides in the difference in the etching progressing g speeds caused by the positional relationship between the front side opening 72 and the back side opening 71. That is, at the central portion A of the slot, the etching progressing speed is large (high) and this portion is etched with a sufficient speed to thereby form the thin steps 81 and 82. On the other hand, at the upper end portion B, the etching progressing speed is small (low) and this portion is not sufficiently etched, so that the etching progresses from the back side opening 71 having a small opening width and, hence, the steps 85 and 88 having large thickness are formed. As a result, a spot of the electron beam passing the slot and landing on the fluorescent surface provides a curved shape in which upper and lower end portions of a boundary line of the outer peripheral side of the Braun tube because the incident electron beam 73 is shut off by the thickened step 86 formed to the side wall section 88 on the outer peripheral side which is not subjected to the sufficient etching working.

Furthermore, though mentioned hereinlater with reference to FIG. 3, a boundary line 39 (central side of the shadow mask) of an electron beam 31 varies in the electron beam passing position by a back side opening 11 having an enlarged opening area. For this reason, in the case of the slot having substantially a rectangular shape, the electron beam 31 passing the central portion of the slot cannot pass the same position as the boundary line 39 mentioned above, and in the spot landing on the fluorescent surface, both the ends of the longitudinal direction of the boundary line 39 may provide a curved shape towards the central side of the shadow mask.

Accordingly, when the conventional shadow mask 61 is used, both the longitudinal ends of the spot 91 of the electron beam passing the slot and landing on the fluorescent surface provides a shape, as shown in FIG. 9, curved so as to approach the axis of ordinate passing the central portion of the fluorescent surface of the Braun tube. Such deformation of the spot 91 becomes large as the incident angle of the electron beam 73 becomes large, that is, as the electron beam 73 becomes apart from the axis of ordinate mentioned above and is directed in the bilateral direction.

FIG. 10 is a schematic view showing the deformed spot 91 landing on the fluorescent surface of the Braun tube. Such deformation of the electron beam spot 91 may provide a problem of not obtaining sufficient luminance which is obtained in essential by landing the spot on the fluorescent surface with the rectangular shape. Moreover, the shapes of the spots differ from each other at various portions of the fluorescent surface of the Braun tube, so that there is a fear of causing difference in the luminance at different portions and generating an illumination variety of R, G, B colors, thus also providing a problem.

DISCLOSURE OF THE INVENTION

In order to solve the above problems, an object of the present invention is to provide a shadow mask so that a spot of an electron beam landing on a fluorescent surface of a Braun tube takes a desired rectangular shape.

The present invention provides a shadow mask for a Braun tube having a plurality of slots forming beam spots, each having substantially a rectangular shape, uniformly on a fluorescent surface of a color Braun tube, the shadow mask being characterized in that the slots include a slot having substantially a rectangular shape and formed at a portion near an axis of ordinate passing a central portion of the shadow mask and a curved slot formed on an outer peripheral side thereof apart from the axis of ordinate; the rectangular slot is composed of a back side opening formed on an electron beam incident side through an etching process so as to have substantially a rectangular shape, a front side opening formed through the etching process so as to have substantially a rectangular shape having a large area so as to allow the electron beam to pass and side wall sections inclining between the back side opening and the front side opening; the curved slot is composed of a back side opening formed on the electron beam incident side through the etching process so as to be curved such that both longitudinal end portions thereof are apart from the axis of ordinate, a front side opening formed through the etching process so as to have substantially a rectangular shape having a large area so as to allow the electron beam to pass and side wall sections inclining between the back side opening and the front side opening; and the curving of the back side opening of the curved slot becomes large as both the longitudinal end portions are apart from the axis of ordinate.

According to this invention, since the curved slot, which is formed by curving both longitudinal end portions of substantially a rectangular slot so as to be apart from the axis of ordinate passing the central portion of the shadow mask, is formed, the electron beam, which is shielded by the side wall sections of both the longitudinal end portions of the slot having the conventional shape, can pass without being shielded. As a result, both the longitudinal end portions of the spot landing on the fluorescent surface of the Braun tube do not lack. Furthermore, since such curved slot has a long side edge, which is also curved, on the central side of the shadow mask forming the slot, the spot of the electron beam landing on the fluorescent surface of the Braun tube does not vary even in a case where a distance between the end face edges of the back side openings of both the longitudinal end portions of the slot is widened. Still furthermore, the curving of the curved slot becomes large as the slot is apart from the axis of ordinate passing the central portion of the shadow mask, so that it can be possible to follow the variation of the incident angle of the electron beam to the curved slot, and the electron beam spot having substantially the rectangular shape can be formed over the entire area of the fluorescent surface of the Braun tube. Therefore, according to the shadow mask of the present invention, since the spot of substantially the rectangular shape can be uniformly on the fluorescent surface of the Braun tube, the electron beam can be landed on the predetermined position and the lowering of the luminance and the luminescent irregularity can be prevented from causing.

In the present invention of the characters mentioned above, it is preferred that a step is formed to the side wall section of the curved slot in which an etching surface on the front side opening side having a depth gradually reduced towards both the longitudinal end portions from the central portion of the curved slot and an etched surface on the back side opening side having a depth gradually increased are contacted at an intermediate portion in a thickness direction, and the back side opening of the curved slot is provided with end face edges having opposing width which is widened towards both the longitudinal end portions from the central portion of the curved slot.

According to this invention, since the step is formed, to the intermediate portion in the thickness direction of the side wall section of the curved slot, with the etched surface on the front side opening side having a depth gradually reduced towards both the longitudinal end portions from the central portion of the curved slot and the etching surface on the back side opening side having a depth gradually increased, the thickness of the step is thickened towards the both longitudinal end portions of the slot. For this reason, the boundary line, at the outer peripheral side of the shadow mask, of the electron beam passing both the longitudinal end portions of the slot is prevented from passing by the thickened step. However, since the back side opening of the curved slot is formed so that both the longitudinal end portions are curved towards the outer peripheral side of the shadow mask, the electron beam passing both the end portions of the slot can pass the same position of coordinate as that of the boundary line of the electron beam passing the central portion of the slot. As a result, the spot landing on the fluorescent surface has a straight boundary line.

Simultaneously, the back side opening of the curved slot has the end face edges having a widened opposing width towards both the longitudinal end portions from the central portion of the curved slot, so that the end face edge, on the central side of the shadow mask, of the longitudinal end face edges of the back side opening is formed to be parallel to the axis of ordinate mentioned above. As a result, the electron beam entering the curved slot on the central side of the shadow mask constitutes a straight boundary line without being curved, passes the slot and is landed on the fluorescent surface of the Braun tube. As a result, the shape of the spot landing on the fluorescent surface of the Braun tube can be made rectangular without being curved.

Furthermore, it is preferred that the curved slot has an angle of less than 10° which is constituted by a curving degree indication line connecting a central point of the curved slot and a central point of an opening width between both the longitudinal end portions and the axis of ordinate passing the central point of the curved slot.

According to this invention, by curving the slot, which is made large as being apart from the axis of ordinate passing the central portion of the shadow mask, at a degree of less than 10° with respect to the axis of ordinate passing the central portion of the curved slot, the spot having substantially a rectangular shape can be uniformly formed on the fluorescent surface of the Braun tube.

BRIEF DESCRIPTION OF THE DRAWINGS

FIG. 1 includes (i) a front view of a slot at a point S at which an X-axis and Y-axis of coordinate shown in FIG. 6 cross to each other, (ii) an A1—A1 sectional view, and (iii) an A2—A2 sectional view.

FIG. 2 includes (i) a front view of a slot at a point P on the Y-axis of coordinate shown in FIG. 6, (ii) a B1—B1 sectional view, and (iii) a B2—B2 sectional view.

FIG. 3 includes (i) a front, view of a slot at a point R on the X-axis of coordinate shown in FIG. 6, (ii) a C1—C1 sectional view, and (iii) a C2—C2 sectional view and (iv) a C3—C3 sectional view.

FIG. 4 includes (i) a front view of a slot at a point Q on a diagonal line shown in FIG. 6, (ii) a D1—D1 sectional view, (iii) a D2—D2 sectional view, and (iv) a D3—D3 sectional view.

FIG. 5 illustrates one example of a photo mask pattern for manufacturing a shadow mask and positional relationship between the respective patterns.

FIG. 6 is a general view of a shadow mask for a conventional color Braun tube having a plurality of slots each having substantially a rectangular shape.

FIG. 7 includes schematic views showing positional relationship of front side openings and back side openings at various portions of a conventional shadow mask.

FIG. 8 includes a view showing a central portion of the conventional shadow mask and sectional views of an upper end portion thereof.

FIG. 9 includes a view showing a slot of a conventional shadow mask and a view showing a spot of an electron beam passing that slot and landing on a fluorescent surface of the Braun tube.

FIG. 10 is a schematic view showing a landing state of the deformed spot on the fluorescent surface of the Braun tube.

BEST MODE FOR EMBODYING THE INVENTION

FIGS. 1 to 4 show shapes of slots formed to various portions of a shadow mask for a Braun tube according to the present invention. The entire shape of the shadow mask according to the present invention is the same as the conventional shadow mask 61 shown in FIG. 6 and is composed of a slot forming portion 62 and a skirt portion 63. The slot is composed of a back side opening 1 formed on an incident side of an electron beam 9 through an etching working, a front side opening 2 formed with a large area so as not to obstruct the passing of the electron beam 9 and side wall sections 3, 4, 5 and 6 inclining between the back side opening 1 and the front side opening 2. In the shadow mask of the present invention, the slot is formed so that spots of the electron beam each having substantially a rectangular shape are formed on the entire fluorescent surface of the Braun tube.

Shapes of slots formed to various portions of the shadow mask will be described hereunder.

FIG. 1 includes (i) a front view of a slot at a point S at which an X-axis and Y-axis of coordinate shown in FIG. 6 cross to each other, (ii) an A1—A1 sectional view, and (iii) an A2—A2 sectional view.

As shown in. FIG. 1(i), the slot at the point S has a back side opening 1 and a front side opening 2, each of which is formed so as to provide substantially a rectangular shape. The electron beam 9 enters at right angle with respect to the slot at the point S, so that the front side opening 2 is formed as if the back side opening 1 is the center thereof. Accordingly, the center M of the front side opening 2 and the center N of the back side opening 1 accord with each other, and as shown in FIGS. 1(ii) and (iii), the side wall sections 3 and 4 formed through the etching working have bilaterally symmetrical shapes. Further, to the side wall sections of the slot, there are formed steps at which the etched surface of the front side opening side and the etched surface of the back side opening side contact to each other at an intermediate portion in the thickness direction thereof.

As shown with the sectional view of FIG. 1(ii), at the central portion of the slot, since an etching progressing speed is large, thicknesses H and h of steps 15 and 16 formed to the side wall sections 3 and 4 are both made thin.

On the other hand, as shown with the sectional view of FIG. 1(iii), at the lower end portion of the slot, since the etching progressing speed is small, the etching progresses from the back side opening side having a smaller opening width. As a result, the thicknesses H and h of the steps 15 and 16 formed to the side wall sections 3 and 4 are made thicker than those shown in the case of FIG. 1(ii) and the etched opening area of the back side opening 1 is made large to thereby enlarge the end face edge. However, regardless of the difference in the etching speeds, a width W between the steps 15 and 16 through which the electron beam 9 passes is formed with the same width as that at the central portion of the slot as shown in FIG. 1(ii). Therefore, the electron beam 9 passing the slot at the point S forms a spot having substantially a rectangular shape on the fluorescent surface of the Braun tube.

FIG. 2 includes (i) a front view of a slot at a point P on a Y-axis of coordinate shown in FIG. 6, (ii) a B1—B1 sectional view, and (iii) a B2—B2 sectional view.

As shown in FIG. 2(i), the slot of the point P has the back side opening 1 and the front side opening 2 having the same shapes as those of the slot of the point S shown in FIG. 1. The front side opening 2 is formed so as to be shifted towards the outer peripheral side of the shadow mask with respect to the back side opening 1 so as not to obstruct the passing of the electron beam 9 entering obliquely to the slot. Since the slot of the point P exists on the Y-axis of coordinate, the center M of the front side opening 2 and the center N of the back side opening 1 are coincident with each other. As shown in FIGS. 2(ii) and (iii), the side wall sections 3 and 4 formed through the etching working have the shapes symmetric with each other.

The sectional shapes of the respective portions of the slot of the point P shown in FIGS. 2(ii) and (iii) are the same as the sectional shapes of the respective portions of the slot of the point S shown in FIGS. 1(ii) and (ii), and the slot of FIG. 2 is formed by the same etching mode. For this reason, the oblique incident electron beam 9 passing through the slot at the point P forms a spot in an approximately rectangular shape on the fluorescent surface without being obstructed by the front side opening 2.

FIG. 3 includes (i) a front view of a slot at a point R on an X-axis of coordinate shown in FIG. 6, (ii) a C1—C1 sectional view, (iii) a C2—C2 sectional view, and (iv) a C3—C3 sectional view.

As shown in FIG. 3(i), the slot of the point R is formed of a front side opening 2 having an approximately rectangular shape and a back side opening 11 which is formed such that longitudinal both end portions (upper and lower end portions) of the back side opening 1 having an approximately rectangular shape shown in FIG. 1 or FIG. 2 are curved so as to be apart from the Y-axis of coordinate shown in FIG. 6 (axis of ordinate passing the center of the shadow mask). The front side opening 2 is formed so as to be shifted towards the outer peripheral side of the shadow mask with respect to the back side opening 11 so as not to obstruct the passing of the electron beam 31 entering obliquely to the slot. For this reason, the center M of the front side opening 2 is shifted towards the outer peripheral side of the shadow mask 1 with respect to the center N of the back side opening 1.

As shown in the sectional view of FIG. 3(ii), the etching progresses at a high speed at the central portion of the slot, so that the thicknesses H and h of the steps 35 and 36 formed respectively to the side wall sections 3 and 4 are made thin. However, since the opening center M of the front side opening 2 is shifted towards the outer peripheral side of the shadow mask, the thickness H of the step 35 formed to the side wall section 3 on the central side of the shadow mask is larger than the thickness h of the step 36 formed to the side wall section 4 on the outer peripheral side. As mentioned above, the electron beam 31 incident obliquely to the C1—C1 section of the slot formed through the etching working passes the slot with the width W which is determined by the end face edge 37 of the back side opening 11 on the central side of the shadow mask and the step 36 of the side wall section 4 on the outer peripheral side thereof. The width W of the electron beam 31 at this time becomes equal to the width W between steps 15 and 16 formed to the rectangular slot shown in FIG. 1.

As shown in the sectional view of FIG. 3(iii), since the etching progresses at a slightly reduced speed at the lower end portion of the slot, the etching progresses from the back side opening 11 and its depth is slightly made large instead that the etching depth from the front opening 2 is made small. As a result, the thickness H and h of the respective steps 35 and 36 of the side wall section 3 are made thick respectively more than that in the case shown in FIG. 3(ii), and the etching opening area of the back side opening 11 is made slightly large. However, the positions of coordinate of the end face edge 37 of the back side opening 11 on the central side of the shadow mask is substantially equal to the position of coordinate of the end face edge shown in FIG. 3(ii). Likely, the position of coordinate of the step 36 of the side wall section 4 on the outer peripheral side of the shadow mask has the same position of coordinate which is shifted, in the depth direction, from the position of the coordinate of the step 36 shown in FIG. 3(ii). As mentioned above, the electron beam 31 incident from the oblique direction to the C2—C2 section of the etched slot passes the slot with the width W which is determined by the end face edge 37 of the back side opening 11 on the central side of the shadow mask and the step 36 of the side wall section 4 on the outer peripheral side thereof. In spite of the fact that the position at which the back side opening 11 of the C2—C2 section is formed is on the side near the opening center M of the front side opening 2 rather than the C1—C1 section, the width W of the passing electron beam 31 becomes equal to the width W between the steps 15 and 16 of the rectangular slot shown in FIG. 1 and then the width of the electron beam passing the section of FIG. 3(ii) and the position of coordinate are coincident.

As shown in the sectional view of FIG. 2(iv), since the etching progresses at a slow speed at the lower end portion of the slot, the etching progresses from the back side opening 11 and its depth is made large instead that the etching depth from the front opening 2 is made further small. As a result, the thicknesses H and h of the respective steps 35 and 36 of the side wall section 3 are made thick respectively more than in the case shown in FIG. 3(ii), and the etching opening area of the back side opening 11 of the central side of the shadow mask is made further large. However, the position of coordinate of the end face edge 37 of the back side opening 11 on the central side of the shadow mask is substantially equal to the position of coordinate of the end face edge shown in FIGS. 3(ii) and 3(iii). Likely, the position of coordinate of the step 36 of the side wall section 4 on the outer peripheral side of the shadow mask has the same position of coordinate which is shifted upward from the position of the coordinate of the step 36 shown in FIGS. 3(ii) and (iii). As mentioned above, the electron beam 31 incident from the oblique direction to the C3—C3 section of the etched slot passes the slot with the width W which is determined by the end face edge 37 of the back side opening 11 on the central side of the shadow mask and the step 36 of the side wall section 4 on the outer peripheral side thereof. In spite of the fact that the position at which the back side opening 11 of the C3—C3 section is formed is on the side further near the opening center M of the front side opening 2 rather than the C2—C2 section, the width W of the passing electron beam 31 becomes equal to the width W between the steps 15 and 16 of the rectangular slot shown in FIG. 1 and then, the width of the electron beam passing the sections of FIGS. 3(ii) and (iii) and the position of coordinate are coincident.

FIG. 4 includes (i) a front view of a slot at a point Q on a diagonal coordinate shown in FIG. 6, (ii) D1—D1 sectional view, (iii) a D2—D2 sectional view, and (iv) a D3—D3 sectional view.

As shown in FIG. 4(i), the slot of the point Q is formed of a front side opening 2 and a back side opening 11 having substantially the same shape as that of the curved slot on the point R shown in FIG. 3. Herein, the reason why substantially the same shape is taken resides in that a slight adjustment is required due to the incident angle of the electron beam as far as the position of coordinate of the shadow mask formed with the slot is concerned. The front side opening 2 is formed to be shifted on the side of the outer periphery of the shadow mask with respect to the back side opening 11 so as not to obstruct the passing of the electron beam 31 entering obliquely to the slot. The slot on the point Q is positioned on the diagonal coordinate and positioned just aside the rectangular slot on the point P shown in FIG. 2 and directly above the curved slot on the point R shown in FIG. 3. Accordingly, the slot is formed so that the relative position of the front side opening 2 with respect to the back side opening 11 has the same position of coordinate as that of the curved slot on the point R in the X-axis of coordinate direction and has the same position of coordinate as that of the rectangular slot on the point P in the Y-axis of coordinate direction.

The sectional shapes of the respective portions of the slot on the point Q shown in FIGS. 4(ii), (iii) and (iv) approximately correspond to those of the curved slot on the point R shown in FIGS. 3(ii), (iii) and (iv), respectively, and the slot is formed by substantially the same etching processes. For this reason, the electron beam 31 obliquely entering and passing the slot on the point Q forms a spot having substantially a rectangular shape on the fluorescent surface without being obstructed by the front side opening 2.

As mentioned above, the slot arranged on the laterally outer peripheral side of the shadow mask varies in sectional shape due to the lowering of the etching progressing speed as directing from the central portion of the slot towards the lower end portion thereof. That is, the etching depth from the front side opening 2 is made small from the central portion of the slot towards the lower end portion thereof, so that the etching depth from the back side opening 11 is made relatively large. As a result, the thicknesses H and h of the steps 35 and 36 of the side wall sections 3 and 4 are made thick and the etching opening area is hence made large.

A boundary line 40 of the electron beam 31 passing the slot lower end portion on the outer peripheral side of the shadow mask is obstructed to pass by the thickened step 36. Therefore, in the case of the rectangular slot as in the conventional case, the electron beam 31 passing the central portion of the slot cannot pass the same position of this boundary line 40 and the spot landing on the fluorescent surface is curved with a variation having notches at both longitudinal end portions of the boundary line 40. However, in the present invention, the back side opening 11 is formed so that both the longitudinal end portions of the slot are curved towards the outer peripheral side of the shadow mask. Accordingly, the electron beam 31 passing the lower end portion of the slot can pass the same position of coordinate of the boundary line 40 of the electron beam 31 passing the central portion of the slot even in the case that the thickened step 36 is formed, and thus, the boundary line 40 of the spot landing on the fluorescent surface is made straight.

On the other hand, a boundary line 39 of the electron beam 31 passing the lower end portion of the slot on the central side of the shadow mask varies its passing position by the back side opening 11 having a widened opening area. For this reason, in the case of the rectangular slot as in the conventional case, the electron beam 31 passing the central portion of the slot cannot pass the same position of this boundary line 39 and the spot landing on the fluorescent surface varies such that both the longitudinal end portions of the boundary line 39 are curved to the central side of the shadow mask. However, in the present invention, the back side opening 11 is formed so that both the longitudinal end portions of the slot are curved towards the outer peripheral side of the shadow mask. Accordingly, the position of coordinate of the end face edge 37 of the back side opening 11 is substantially the same at the central portion of the slot and the lower end portion thereof. As this result, the electron beam 31 passing the lower end portion of the slot can pass the same position of coordinate of the boundary line 39 of the electron beam 31 passing the central portion of the slot even in the case that the opening area of the back side opening 11 is widened, and thus, the boundary line 39 of the spot landing on the fluorescent surface is made straight.

As such phenomenon is observed at the upper end portion as well as the lower end portion of the slot, so that it is preferred that the upper end side of the slot has the shape similar to that of the lower end side thereof. As a result, the shape of the spot landing on the fluorescent surface of the Braun tube can be made substantially rectangular without being curved by forming the back side opening 11 so as to be apart from the Y-axis of coordinate.

Further, since the thickness H of the step 351 of the side wall section 3 on the central side of the shadow mask is formed to be relatively large, the step is not deformed even if a large pressing pressure is applied at the time of pressing working of the shadow mask. Further, even if it be deformed, it is not so largely deformed as to deform the shape of the spot of the electron beam 31 landing on the fluorescent surface of the Braun tube.

It is desirable that the degree of curving of the curved slot is less in angle than 10 degs. according to the respective portions of the shadow mask 1. The degree of curving is shown by an angle constituted by a curved degree indication line connecting the central point of the curved slot and the central point of the opened width of both the longitudinal end portions of the curved slot and the axis of ordinate passing the central point of the curved slot.

As explained with reference to FIGS. 1 and 2, at a portion near the axis of ordinate passing the central point of the shadow mask 1, the electron beam enters from approximately the front side at the right angle with respect to the slot, so that the electron beam is less influenced by the thickened step formed to the upper and lower end portions of the slot as being shielded thereby. Moreover, the electron beam is hardly influenced at the portion near the axis of ordinate even on the upper or lower edge side of the shadow mask. For this reason, it is preferred that the slot, near the axis of ordinate, passing the central portion of the shadow mask 1 has a rectangular shape or a shape curved at a small angle.

However, as explained with reference to FIGS. 3 and 4, on the outer peripheral side of the shadow mask 1, the electron beam enters in a manner inclined obliquely with respect to the slot, so that the electron beam is shielded by the thickened steps formed to both the longitudinal end portion of the slot. The degree of this shielding by the thickened step is made large as an incident angle of the electron beam with respect to the slot is made small, that is, the electron beam is apart from the axis of ordinate passing the central portion of the shadow mask, and accordingly, it is preferred to be made large the angle for curving the slot in the range mentioned above as the electron beam is apart from the axis of ordinate passing the central portion of the shadow mask. Further, since the degree of this shielding is not so different at the upper and lower edge sides, it is preferred that the angle for curving the slot is made same in the case where the distance from the axis of ordinate passing the central portion of the shadow mask is same.

Next, a photomask for manufacturing the shadow mask for the Braun tube mentioned hereinabove will be explained.

FIG. 5 shows one example of a photomask pattern for manufacturing the shadow mask 1 and a positional relationship between the respective patterns. FIG. 5(i) shows a front side opening pattern 52 for forming the front side opening 2 having substantially a rectangular shape of the shadow mask, FIG. 5(ii) shows a back side opening pattern 51 forming the curved back side opening 1 of the shadow mask, and FIG. 5(iii) shows a positional relationship between the respective patterns at the time of exposure using the photomask having the front side opening pattern 52 and the photomask having the back side opening pattern 51.

The front side opening pattern 52 has a rectangular shape having corner portions of right angles as shown in FIG. 5(i). The photomask having this front side opening pattern 52 is located at a predetermined position corresponding to the rectangular front side opening 2 of the shadow mask 1.

The back side opening pattern 51 is, as shown in FIG. 5(ii) a bent pattern formed so as to be apart from the axis of ordinate passing the central portion of the photomask so that a rectangular upper pattern section 53 and a rectangular lower pattern section 54 are formed to be symmetrical in the vertical position. The bent pattern has a bent angle of less than 1.0 degs. with respect to the axis of ordinate passing the central point 55 of the pattern. Since the bent angle is the same angle as the curved angle of the slot of the shadow mask formed after the etching working, the bent angle will be made large as the slot is apart from the axis of ordinate passing the central portion of the photomask. The photomask having such back side opening pattern 51 is located at a position corresponding to the curved back side opening 11 of the shadow mask 1. Further, the back side opening located at a portion near the axis of ordinate passing the central portion of the shadow mask 1 has substantially the rectangular shape, so that a rectangular back side opening pattern is likely formed to a portion near the central portion of the photomask.

The shadow mask 1 can be formed by using the photomask mentioned above by a conventionally known method. Usually, the respective processes are performed through the photoetching working, and the shadow mask is manufactured by a continuous inline system. For example, a water-soluble collidal photoresist or like is applied to both surfaces of a metal plate and then dried. Thereafter, a photomask having a front side on which the above-mentioned front side opening pattern 52 is formed is closely contacted and a photomask having a back side on which the above-mentioned back side opening pattern 51 is formed is closely contacted, which is thereafter exposed by ultraviolet rays such as high pressure mercury and then developed by using water. Further, as shown in FIG. 5(iii), the arrangement is made such that the positional relationship between the photomask to which the front side opening pattern 52 is formed and the photomask to which the back side opening pattern 51 is formed is the same as the positional relationship between the front side opening 2 and the back side opening 1 (11) formed to the obtained shadow mask. A metal exposed slot portion whose peripheral portion is covered by a resist film image is formed with a specific shape of the respective sections as mentioned hereinbefore on the basis of the difference of the etching progressing speeds at the respective portions. Further, the etching working is performed, after the heat treatment or like, by spraying a ferric chloride solution, and thereafter, by carrying out aftertreatment such as water-washing, peeling, or like treatment, the shadow mask can be manufactured.

By utilizing such photomask, a shadow mask capable of forming a spot of an electron beam having substantially a rectangular shape over an entire area of the fluorescent surface of a Braun tube. By using the thus obtained shadow mask, the electron beam passing the shadow mask is surely irradiated on a predetermined position on the fluorescent surface of the Braun tube without causing positional shifting as in the conventional technology as shown in FIG. 10. As a result, a desired luminance can be obtained over the entire area of the fluorescent surface, and moreover, luminescent irregularity of R, G and B colors is not caused.

Possibility of Industrial Usage

As mentioned hereinbefore, according to the shadow mask for the Braun tube of the present invention, since the curved slot, which is formed by curving both longitudinal end portions of substantially a rectangular slot so as to be apart from the axis of ordinate passing the central portion of the shadow mask, is formed, the electron beam, which is shielded by the side wall sections of both the longitudinal end portions of the slot having the conventional shape, can pass without being shielded. As a result, both the longitudinal end portions of the spot landing on the fluorescent surface of the Braun tube do not lack. Furthermore, since such curved slot has a long side edge, which is also curved, on the central side of the shadow mask forming the slot, the spot of the electron beam landing on the fluorescent surface of the Braun tube does not vary even in a case where a distance between the end face edges of the back side openings of both the longitudinal end portions of the slot is widened. Still furthermore, the curving of the curved slot becomes large as it is apart from the axis of ordinate passing the central portion of the shadow mask, so that it can be possible to follow the variation of the incident angle of the electron beam to the curved slot, and the electron beam spot having substantially the rectangular shape can be formed over the entire area of the flourescent surface of the Braun tube. Therefore, according to the shadow mask of the present invention, since the spot of substantially the rectangular shape can be uniformly on the fluorescent surface of the Braun tube, the electron beam can be landed on the predetermined position and the lowering of the luminance and the luminescent irregularity can be prevented from causing.

We claim:

1. A shadow mask for a Braun tube having a plurality of slots forming beam spots, each having substantially a rectangular shape, uniformly on a fluorescent surface of a color Braun tube, characterized in that said slots include a slot having substantially a rectangular shape and formed at a portion near an axis of ordinate passing a central portion of the shadow mask and a curved slot formed on an outer peripheral side thereof apart from the axis of ordinate, said rectangular slot is composed of a back side opening formed on an electron beam incident side through an etching process so as to have substantially a rectangular shape, a front side opening formed through the etching process so as to have substantially a rectangular shape having a large area so as to allow the electron beam to pass and side wall sections inclining between the back side opening and the front side opening, said curved slot is composed of a back side opening formed on the electron beam incident side through the etching process so as to be curved such that both longitudinal end portion thereof are apart from said axis of ordinate, a front side opening formed through the etching process so as to have substantially a rectangular shape having a large area so as to allow the electron beam to pass and side wall sections inclining between the back side opening and the front side opening, and said curving of the back side opening of the curved slot becomes large as both the longitudinal end portions are apart from the axis of ordinate.

2. A shadow mask for a Braun tube according to claim 1, wherein:

a step is formed to the side wall section of the curved slot in which an etched surface on the front side opening side having a depth gradually reduced towards both the longitudinal end portions from the central portion of the curved slot and an etched surface on the back side opening side having a depth gradually increased are contacted at an intermediate portion in a thickness direction, and the back side opening of the curved slot is provided with end face edges having opposing width which is is widened towards both the longitudinal end portions from the central portion of the curved slot.

3. A shadow mask for a Braun tube according to claim 1 or 2, wherein said curved slot has an angle of less than 10° which is constituted by a curving degree indication line connecting a central point of the curved slot and a central point of an opening width between both the longitudinal end portions and the axis of ordinate passing the central point of the curved slot.

* * * * *